(12) United States Patent
Kuepper et al.

(10) Patent No.: US 7,947,337 B2
(45) Date of Patent: May 24, 2011

(54) METHOD AND APPARATUS FOR PLASMA ENHANCED CHEMICAL VAPOR DEPOSITION

(75) Inventors: Thomas Kuepper, Bad Gandersheim (DE); Lars Bewig, Bad Gandersheim (DE); Christoph Moelle, Mainz (DE); Lars Brandt, Kreiensen (DE); Thomas Niklos, Griesheim (DE)

(73) Assignee: Schott AG (DE)

( * ) Notice: Subject to any disclaimer, the term of this patent is extended or adjusted under 35 U.S.C. 154(b) by 508 days.

(21) Appl. No.: 11/937,280

(22) Filed: Nov. 8, 2007

(65) Prior Publication Data
US 2008/0124488 A1 May 29, 2008

(30) Foreign Application Priority Data
Nov. 10, 2006 (DE) .................. 10 2006 053 366

(51) Int. Cl.
*H05H 1/24* (2006.01)
(52) U.S. Cl. .................. 427/569; 427/575; 427/576
(58) Field of Classification Search .................. 427/569, 427/570, 575, 576
See application file for complete search history.

(56) References Cited

U.S. PATENT DOCUMENTS

| | | | | |
|---|---|---|---|---|
| 5,295,220 A * | 3/1994 | Heming et al. | ............... | 385/142 |
| 5,395,453 A | 3/1995 | Noda | | |
| 5,405,492 A * | 4/1995 | Moslehi | ................ | 438/694 |
| 5,562,952 A | 10/1996 | Nakahigashi et al. | | |
| 7,166,175 B2 * | 1/2007 | Bayer et al. | ............... | 148/525 |
| 2001/0031542 A1 | 10/2001 | Ito et al. | | |
| 2003/0205460 A1 | 11/2003 | Buda | | |
| 2004/0224504 A1 * | 11/2004 | Gadgil | ................ | 438/680 |
| 2006/0138099 A1 | 6/2006 | Namiki et al. | | |
| 2006/0228897 A1 * | 10/2006 | Timans | ................ | 438/758 |
| 2009/0205538 A1 * | 8/2009 | Thompson et al. | ...... | 106/287.18 |

FOREIGN PATENT DOCUMENTS

| | | |
|---|---|---|
| CN | 1631776 A | 6/2005 |
| DE | 41 14 108 C1 | 12/1991 |
| DE | 196 29 877 C1 | 3/1997 |
| DE | 10 2004 042 431 A1 | 3/2006 |
| EP | 1 561 840 A1 | 9/2003 |
| JP | 07-283154 | 10/1995 |

(Continued)

OTHER PUBLICATIONS

Jean-Pierre Corriou, Process Control, London: Springer-Verlag, 2004.*

(Continued)

*Primary Examiner* — Bret Chen
(74) *Attorney, Agent, or Firm* — DeMont & Breyer LLC

(57) ABSTRACT

A method and apparatus for coating substrates by means of plasma enhanced vapor deposition are provided, in which at least part of the surroundings of the substrate surface of a substrate to be coated is evacuated and a process gas with a starting substance for the coating is admitted, wherein the coating is deposited by a plasma being ignited by radiating in electromagnetic energy in the surroundings of the substrate surface filled with the process gas. The electromagnetic energy is radiated in by a multiplicity of pulse sequences, preferably microwave or radiofrequency pulses, with a multiplicity of pulses spaced apart temporally by first intermissions, wherein the electromagnetic energy radiated in is turned off in the intermissions, and wherein the intermissions between the pulse sequences are at least a factor of 3, preferably at least a factor of 5, longer than the first intermissions between the pulses within a pulse sequence.

9 Claims, 2 Drawing Sheets

FOREIGN PATENT DOCUMENTS

Figure 1:
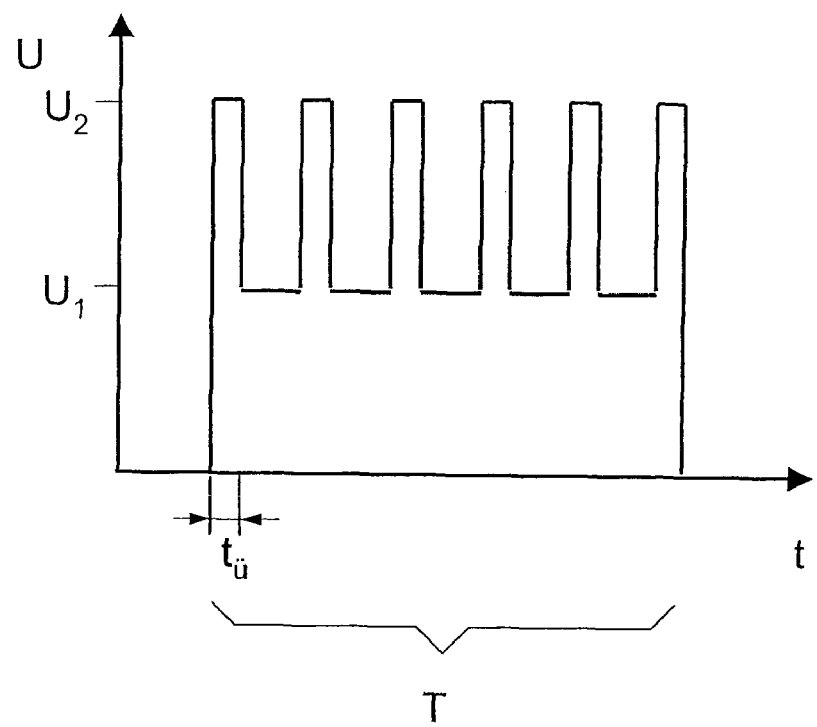

| | | |
|---|---|---|
| JP | 3444013 B2 | 6/2003 |
| WO | 02/098583 A2 | 12/2002 |

OTHER PUBLICATIONS

Kaczor, M., et al., "Numerical simulation of a multi-channel light scattering diagnostic system for low temperature plasmas." Reference, date, page numbers—unavailable.*

Heiden, Christoph, et al., "Power Spectrum of Stochastic Pulse Sequences with Correlation between the Pulse Parameters". Physical Review, vol. 188, No. 1, Dec. 5, 1969, pp. 319-326.*

Dong Lixin, "CN Application No. 200710308199.4 First Office Action", Apr. 17, 2009, Publisher: The Patent Office of the People's Republic of China, Published in: CN.

Dong Lixin, "Chinese Application No. 200710308199.4 2nd Office Action", Oct. 9, 2009, Publisher: Patent Office of the People's Republic of China, Published in: CN.

"Korean Application No. 114461/2009 Office Action", Sep. 18, 2009, Publisher: The Korean Intellectual Property Office, Published in: KR.

* cited by examiner

METHOD AND APPARATUS FOR PLASMA ENHANCED CHEMICAL VAPOR DEPOSITION

The invention relates generally to plasma enhanced chemical vapor deposition, in particular to plasma enhanced chemical vapor deposition by means of pulsed plasmas.

EP 0 522 281 A1 discloses a method and an apparatus in which pulsed microwaves are used to produce a pulsed plasma. In this case, the ignition of the plasma at the beginning of a pulse is supported by a high-voltage pulse or by a boosting of the microwave pulse.

However, the ignited plasma, which is maintained during the pulse duration with the corresponding power of the microwave generator, can result in heating of the substrate to be coated, in particular of the surface thereof, which heating can adversely influence the product properties of temperature-sensitive substrates. Thus, in the case of thermoplastic plastic substrates, for example, a softening of the surface can occur. Moreover, regulating the power of the microwaves is complicated, particularly if accurate layer thicknesses are of importance, because the amount of material deposited in the course of a pulse is determined not only by the length of the pulses but also by the power thereof.

Therefore, the invention is based on the object of solving the problems mentioned above. Said object is already achieved in an extremely surprisingly simple manner by the subject matter of the independent claims. Advantageous configurations and developments of the invention are specified in the dependent claims.

Accordingly, the invention provides a method for coating substrates by means of plasma enhanced vapor deposition, wherein at least part of the surroundings of the substrate surface of a substrate to be coated is evacuated and a process gas with a starting substance for the coating is admitted, wherein the coating is deposited by a plasma being ignited by radiating in electromagnetic energy in the surroundings of the substrate surface filled with the process gas. In this case, the electromagnetic energy is radiated in in the form of a multiplicity of pulse sequences with a multiplicity of pulses spaced apart temporally by first intermissions, wherein the electromagnetic energy radiated in is turned off in the intermissions, and wherein the intermissions between the pulse sequences are at least a factor of 3, preferably at least a factor of 5, longer than the first intermissions between the pulses within a pulse sequence.

A corresponding apparatus for coating substrates by means of plasma enhanced vapor deposition, which can be used to perform the method described above, comprises at least one reactor with a device for evacuating at least part of the surroundings of the substrate surface of a substrate to be coated, and for admitting a process gas with a starting substance for the coating. The apparatus furthermore has a source for pulsed electromagnetic energy which is coupled to the reactor in order to ignite a plasma by radiating in electromagnetic energy in the surroundings of the substrate surface filled with the process gas and to deposit a coating. A control device is provided which controls the source in such a way that the electromagnetic energy is radiated in in the form of a multiplicity of pulse sequences with a multiplicity of pulses spaced apart temporally by first intermissions, wherein the source is inactivated in the first intermissions, and wherein the intermissions between the pulse sequences are at least a factor of 3, preferably at least a factor of 5, longer than the intermissions between the pulses within a pulse sequence.

The invention is accordingly based on the fact that, instead of a periodic boosting of microwave pulses by ignition pulses such as are known from EP 0 522 281 A1, now the ignition pulses are utilized by themselves for plasma generation. In the same way as in EP 0 522 281 A1 pulsed microwaves are preferably used by means of a corresponding source operated in pulsed fashion. A radiofrequency source operated in pulsed fashion is likewise suitable.

The term microwaves in the sense of the invention denotes, in particular, not only microwaves in the literal sense, that is to say electromagnetic waves having wavelengths in the micrometers range, but also electromagnetic waves having frequencies from 1 GHz onward. The term microwave accordingly also encompasses the frequencies which are used for domestic microwave appliances. A suitable microwave frequency is therefore also a frequency of 2.45 GHz as is in widespread use in domestic microwave appliances. A source with a magnetron is suitable, inter alia, for generating the microwaves or the radiofrequency radiation.

Since the electromagnetic pulses such as are used otherwise for plasma pulse induced chemical vapor deposition (PICVD) are split into a sequence of short ignition pulses according to the invention, the heating of the substrate is reduced to a minimum. Since the individual pulses of a pulse sequence are generated in terms of their pulse height in particular like the ignition pulses known from EP 0 522 281 A1, a reliable ignition of the plasma is nevertheless furthermore achieved. The longer pulse intermissions between the individual pulse sequences then serve for exchanging the process gas as completely as possible. This simultaneously prevents the enrichment of undesired reaction products arising in the plasma. In this regard, the situation where a certain amount of electromagnetic power is still coupled in between the ignition pulses within a pulse sequence is not precluded, but the source is operated in such a way that such a power lies below the threshold for maintaining the plasma. This is intended to avoid the situation, in particular, where the substrate is heated more extensively by maintenance of the plasma between the pulses within a pulse sequence.

A further advantage of the invention is that complicated regulation of the power can be dispensed with since plasma generation is effected only by means of the generally poorly regulable ignition pulses anyway. Thus, a development of the invention provides for the pulse power to be coupled in in unregulated fashion. Accordingly, a source having unregulated power output can therefore be used. This considerably simplifies an apparatus of this type compared with known plasma coating installations in which the power output is adjusted to predefined values for example by voltage or current regulation in the magnetron.

Irrespective of whether or not power regulation is performed, accurate supervision with regard to the quantity of the deposited material can nevertheless take place. Thus, for this purpose, the pulse power or at least one variable dependent on the pulse power can be measured and be integrated with respect to time over the individual pulses, wherein the pulse sequence is terminated by means of a control device if the integrated pulse power exceeds a predetermined threshold value. After an intermission of predetermined length, as specified above, the next pulse sequence can then be started. For this purpose, the apparatus is equipped with a measuring device which correspondingly measures the pulse power or at least one variable dependent on the pulse power, wherein the control device is designed to integrate the measured values with respect to time over the individual pulses and to terminate the pulse sequence if the integrated pulse power exceeds a predetermined threshold value and to start the next pulse sequence after an intermission of predetermined length. The measurement variable integrated over the pulses thus supplies a value for the energy deposited in total in the plasma. One possibility in this respect is to measure the field strength coupled out at a waveguide for coupling in the electromagnetic energy and to integrate said field strength with respect to time over the individual pulses. In order to measure the coupled-out field strength, the measuring device can comprise a sensor which measures the coupled-out field strength or power at the waveguide for coupling in the electromagnetic energy.

A further, alternative or additional possibility consists in measuring the intensity of the light emission of the plasma and integrating it with respect to time. The pulse sequence can be terminated if the light emission integrated with respect to time exceeds a predefined threshold value. A device for measuring the light intensity of the plasma is correspondingly provided for this purpose, wherein the control device is set up to terminate a pulse sequence if the intensity of the light emission integrated with respect to time exceeds a predefined threshold value. In this case, the device for measuring the light intensity does not have to detect the entire radiation intensity. Rather, said device can also be designed to spectrally selectively measure the intensity of specific components of the emitted spectrum. Thus, when depositing silicon oxide layers, for instance, it is possible to measure the light intensity of a spectral line of the plasma which is characteristic of silicon. Since the invention, in a manner similar to other PICVD processes, too, is suitable in particular for the deposition of oxide layers, the intensity of characteristic lines of oxygen can also be detected selectively.

A further, alternative or additional possibility for regulating the deposition process consists in measuring the pulse power or at least one variable dependent on the pulse power and integrating it with respect to time over the individual pulses. On the basis of the variables thus measured, the length of the intermissions between the pulse sequences can then be adapted by means of a control device. In this way, too, the average power per unit of time, averaged over a plurality of pulse sequences, can be set.

Since the operation according to the invention by means of pulse sequences—which are separated by longer intermissions—of short pulses separated by shorter intermissions is particular suitable for minimizing the substrate heating, conversely the substrate temperature itself can also be used as a control parameter for the deposition process. For this purpose, by means of a control device set up correspondingly, the substrate temperature can be detected and the length of the pulse sequences or the ratio of the lengths of intermissions between the pulse sequences and the length of the pulse sequence can be adapted on the basis of the detected temperature value. Specifically, it is expedient in this case if the length of the pulse sequences is shortened or the ratio of length of the pulse sequences to length of the pulse intermissions between the pulse sequences is reduced if the substrate temperature lies above a predefined value, and/or the length of the pulse sequence is lengthened or the ratio of length of the pulse sequences to length of the pulse intermissions between the pulse sequences is increased if the substrate temperature lies below a predefined value.

The individual ignition pulses are particularly preferably kept significantly shorter than the length of the pulse sequence in order to reduce the heating of the substrate. In particular, it is favorable in this respect if the pulses in the pulse sequences have a duration that is shorter than $\frac{1}{10}$ of the duration of a pulse sequence. Customary pulses used in PICVD coating methods furthermore have pulse lengths in the milliseconds range. According to the invention, such pulses are now split into a multiplicity of significantly shorter pulses formed as ignition pulses. Thus, pulses in the pulse sequences having a duration of at most 5 microseconds, or even only at most 2 microseconds, are preferably used.

Figure 2:
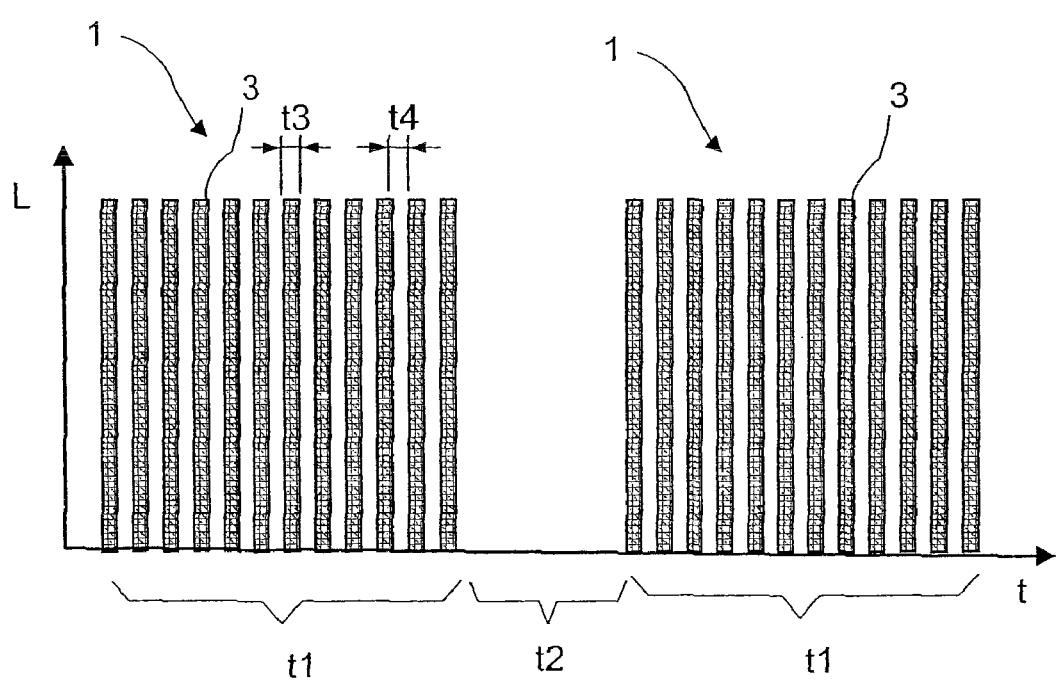
Figure 3:
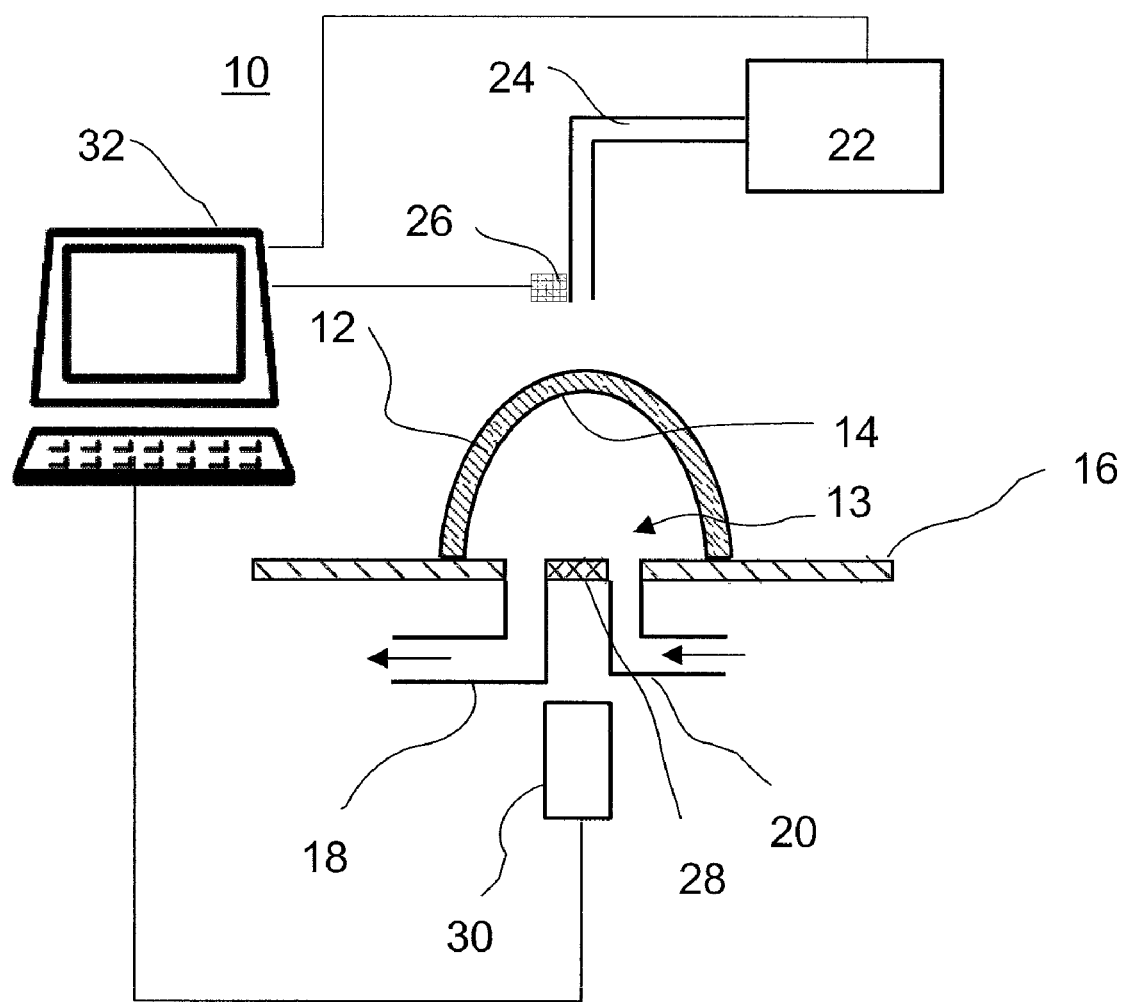

The invention is explained in more detail below on the basis of exemplary embodiments and with reference to the accompanying drawings, in which:

FIG. 1 shows a pulse waveform with periodic pulse boostings such as is known from the prior art, FIG. 2 shows a diagram of pulse sequences with a succession of pulses according to the invention, and FIG. 3 shows a schematic illustration of an apparatus for coating substrates by means of plasma pulse induced chemical vapor deposition using pulse sequences such as are illustrated in FIG. 2.

FIG. 1 illustrates a microwave pulse diagram of a pulse such as is known from the prior art in accordance with EP 0 522 281 A1. Periodic pulse boostings having the height $U_2$ and the shorter duration $t_U$ are superposed on a microwave pulse having the height $U_1$ and the duration T. By means of the periodic pulse boostings, the plasma is ignited and maintained by the intensity of the pulse between the boostings.

FIG. 2 shows a diagram of microwave pulses such as are used according to the invention. In this case, the power L of the pulses is plotted as a function of the time t.

The pulses are radiated into the reactor in the form of pulse sequences having a duration t1. Each of the pulse sequences 1 having the duration t1 is subdivided into individual ignition pulses 3 having the duration t3, wherein between the ignition pulses 3 microwave power is in each case interrupted or turned off for a duration t4. The individual pulse sequences 1 are interrupted by intermissions having the duration t2. In this case, the duration t2 of the intermissions between the pulse sequences 1 is at least a factor of 3, preferably at least a factor of 5, longer than the duration t4 of the intermissions between successive pulses 3 within a pulse sequence 1. The microwave power between the individual pulses 3 within a pulse sequence 1 is preferably vanishing. Insofar, however, as a certain amount of microwave power is still present in the pulse intermissions having the length t4, for example due to the turn-off characteristic of a magnetron as source, said power is lower than the threshold power required for maintaining the plasma between the pulse sequences.

The pulses 3 are in particular also significantly shorter than the duration of the pulse sequence. Preferably, the duration t3, with pulse durations of at most 5 microseconds, or even at most 2 microseconds, is in this case at least a factor of 10 shorter than the duration t1.

In FIG. 2, the pulse power of the individual pulses 3 is illustrated as having an identical magnitude for all of the pulses. In practice, however, the pulse powers can vary, particularly if an unregulated microwave source is used which is only ever switched on and off in each case for generating the pulses 3.

FIG. 3 shows a schematic illustration of an apparatus 10 for coating substrates by means of plasma pulse induced chemical vapor deposition using pulse sequences such as are illustrated in FIG. 2. The apparatus 10 is designed by way of example for coating the inside surface 14 of substrates 12 in the form of headlight spherical caps. For this purpose, the spherical cap 12 is placed onto a sealing surface 16, such that the inner surface 14 is sealed with respect to the surroundings. By means of a pump, the volume 13 thus created, which surrounds the inner surface 14, is evacuated via a discharge line 18. Process gas with the starting substances of the layer to be deposited is introduced into the closed-off volume 13 via a supply line 20. By means of a microwave source 22, the microwaves are conducted to the spherical cap 12 via a waveguide 24. The microwaves coupled into the volume 13 via the waveguide cause the ignition of a plasma in the volume 13. As a result, reaction products are produced in the plasma and deposit on the inner side 14 of the spherical cap 13 as a coating. As gaseous starting substances, for example a silicon precursor and a titanium precursor mixed with oxygen can alternately be admitted in order to produce titanium oxide/silicon oxide alternate layers. These alternate layers can then serve as an interference layer system for influencing the optical properties of the spherical cap 12.

Generally, HMDSO (hexamethyldisiloxane), for example, is suitable as silicon precursor. Titanium chloride ($TiCl_4$) in particular, is suitable for depositing titanium oxide layers. The alternate layer system deposited can be for example a cold light reflector layer.

The microwave source 22 is operated in pulsed fashion, wherein the source 22 is switched in such a way that a pulse sequence waveform as illustrated schematically by way of example in FIG. 2 is produced. In this case, the switching of the microwave source is effected by means of a control device 32, which correspondingly switches the source 22 in such a way that a multiplicity of pulses spaced apart temporally by first intermissions are radiated in, wherein the electromagnetic energy radiated in is turned off in the intermissions, and wherein the intermissions between the pulse sequences are at least a factor of 3, preferably at least a factor of 5, longer than the first intermissions between the pulses within a pulse sequence.

A measuring device 30 can additionally be provided, which measures the intensity of the light emission of the plasma through a window 28. The measured values can then be integrated with respect to time by the control device. If a predefined threshold value for the integrated intensity is exceeded the pulse sequence can be terminated. This ensures that the predefined layer thickness is obtained. As an alternative or in addition the length of the intermissions between the pulse sequences can also be adapted.

The measuring device can alternatively or additionally be designed to determine the temperature of the substrate surface, for example by means of a pyrometric measurement. The length of the intermissions or the ratio of intermissions between the pulse sequences and the duration of the pulse sequences can then be adapted depending on the substrate temperature. In this case, it is expedient if, by means of the control device 32, the length of the pulse sequences is shortened or the ratio of length of the pulse sequences to length of the pulse intermissions between the pulse sequences is reduced if the substrate temperature lies above a predefined value, and/or the length of the pulse sequence is lengthened or the ratio of length of the pulse sequences to length of the pulse intermissions between the pulse sequences is increased if the substrate temperature lies below a predefined value.

As an alternative or in addition, a sensor 26 can moreover be arranged at the waveguide 24, which sensor measures the power coupled out from the microwave source 22. Said sensor 26 is also connected to the control device 32, such that the measured values of the sensor 26 can be used in an analogous manner to the measuring device 30 for controlling the length of the pulse sequences by means of the control device 32.

It is evident to the person skilled in the art that the invention is not restricted to the exemplary embodiments described above but rather can be varied in diverse ways. In particular, the features of the individual exemplary embodiments can also be combined with one another or individual specific features can also be omitted, without departing from the essence of the invention.

The invention claimed is:

1. A method for coating substrates by means of plasma enhanced vapor deposition, the method comprising:
   evacuating at least part of the surroundings of the substrate surface of a substrate to be coated with a coating;
   admitting a process gas with a starting substance for the coating; and
   depositing the coating by a plasma being ignited by radiating in electromagnetic energy in the surroundings of the substrate surface filled with the process gas;
   wherein the electromagnetic energy is radiated in the form of a multiplicity of pulse sequences with a multiplicity of pulses spaced apart temporally by first intermissions, wherein intermissions between the pulse sequences are at least a factor of 3 longer than the first intermissions between the pulses within a pulse sequence, and wherein the electromagnetic energy radiated in is turned off in the first intermissions and in the intermissions between the pulse sequences;
   wherein the intensity of specific components of the emitted light spectrum of the plasma is spectrally selectively measured and integrated with respect to time; and
   wherein the pulse sequence is terminated when the measured light emission integrated with respect to time exceeds a predefined threshold value.

2. The method as claimed in claim 1, wherein the pulse power or at least one variable dependent on the pulse power is measured and integrated with respect to time over the individual pulses, wherein the pulse sequence is terminated by means of a control device when the integrated pulse power exceeds a predetermined threshold value and the next pulse sequence is started after an intermission.

3. The method as claimed in claim 2, wherein the field strength coupled out at a waveguide for coupling in the electromagnetic energy is measured and integrated over the individual pulses.

4. The method as claimed in claim 1, wherein the pulse power or at least one variable dependent on the pulse power is measured and integrated with respect to time over the individual pulses, wherein the length of the intermissions between the pulse sequences is adapted by means of a control device on the basis of the measured variable.

5. The method as claimed in claim 1, wherein the substrate temperature is detected and the length of the pulse sequences or the ratio of the lengths of intermissions between the pulse sequences and the length of the pulse sequence is adapted on the basis of the detected temperature value.

6. The method as claimed in claim 5, wherein the length of the pulse sequences is shortened or the ratio of length of the pulse sequences to length of the intermissions between the pulse sequences is reduced when the substrate temperature lies above a predefined value, and/or the length of the pulse sequence is lengthened or the ratio of length of the pulse sequences to length of the intermissions between the pulse sequences is increased when the substrate temperature lies below a predefined value.

7. The method as claimed in claim 1, wherein the pulses in the pulse sequences have a duration that is shorter than 1/10 of the duration of a pulse sequence.

8. The method as claimed in claim 1, wherein the pulses in the pulse sequences have a duration of at most 5 microseconds.

9. The method as claimed in claim 1, wherein the pulse power is coupled in an unregulated fashion.

* * * * *